United States Patent
Tang

[11] Patent Number: 6,008,072
[45] Date of Patent: Dec. 28, 1999

[54] TAPE AUTOMATED BONDING METHOD

[75] Inventor: Pao-Yun Tang, Hsinchu, Taiwan

[73] Assignee: Industrial Technology Research Institute, Hsin-Chu, Taiwan

[21] Appl. No.: 08/579,511

[22] Filed: Dec. 27, 1995

[51] Int. Cl.⁶ .......................... H01L 21/56; H01L 21/58; H01L 21/603
[52] U.S. Cl. ........................... 438/118; 438/119; 438/125
[58] Field of Search .................... 257/783; 438/118, 438/119, 125

[56] References Cited

U.S. PATENT DOCUMENTS

| | | | |
|---|---|---|---|
| 4,731,282 | 3/1988 | Tsukagoshi et al. | 428/220 |
| 4,740,657 | 4/1988 | Tsukagoshi et al. | 174/88 |
| 4,963,002 | 10/1990 | Tagusa et al. | 350/336 |
| 5,001,542 | 3/1991 | Tsukagoshi et al. | 357/68 |
| 5,330,684 | 7/1994 | Emori et al. | |
| 5,393,359 | 2/1995 | Chang et al. | |
| 5,393,697 | 2/1995 | Chang et al. | |
| 5,508,228 | 4/1996 | Nolan et al. | |
| 5,582,242 | 12/1996 | Hamburgen et al. | |
| 5,729,315 | 3/1998 | Takahashi et al. | |
| 5,749,997 | 5/1998 | Tang et al. | |

FOREIGN PATENT DOCUMENTS 362927  3/1991  Japan.

*Primary Examiner*—David E. Graybill
*Attorney, Agent, or Firm*—George O. Saile; Stephen B. Ackerman; Larry J. Prescott

[57] ABSTRACT

This invention provides a bonded structure and a method of forming the bonded structure for joining a lead array to the conducting bonding pads of an integrated circuit element. The invention uses an anisotropic conductive film with tape automated bonding to form the bonded structure. The invention provides a method of tape automated bonding which uses lower temperature and pressure in the bonding process and provides a bond which is automatically encapsulated after the bonding has been completed.

10 Claims, 8 Drawing Sheets

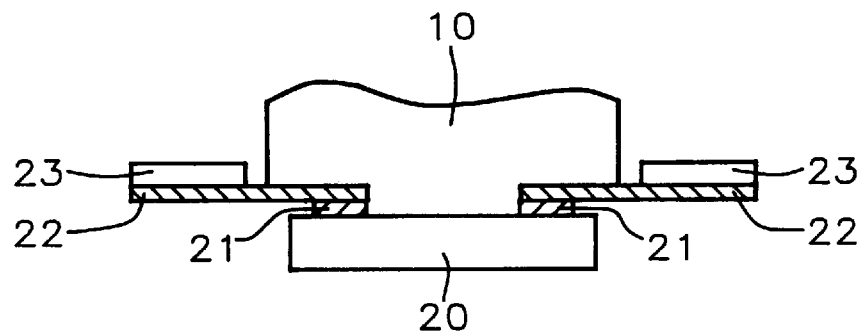
FIG. 1 - Prior Art
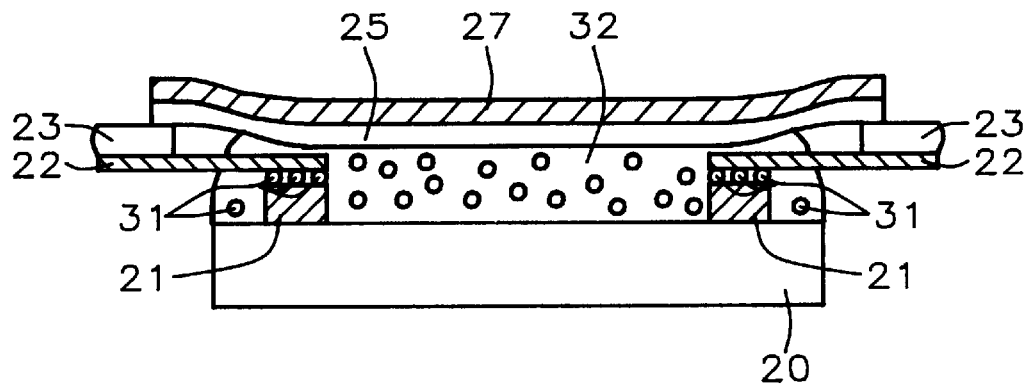
FIG. 2A
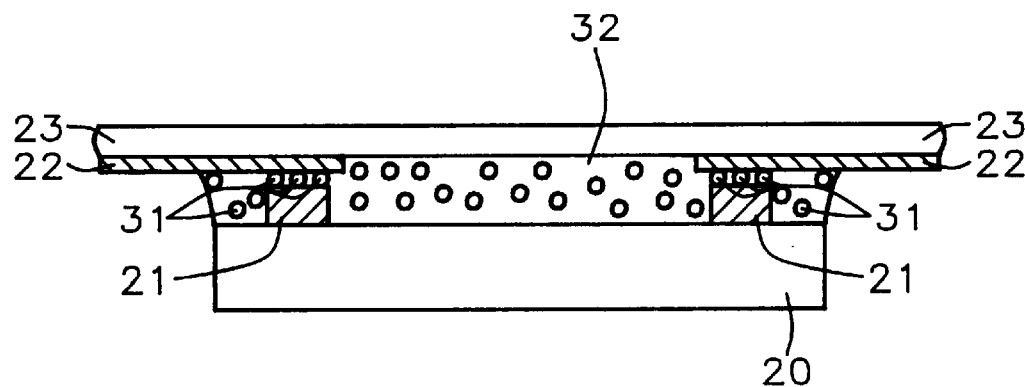
FIG. 2B

TAPE AUTOMATED BONDING METHOD

RELATED PATENT APPLICATIONS (1) (E83-0002), Ser. No. 08/239,375, filed May 6, 1994, now abandoned, entitled "Composite Bump Bonding" assigned to the same assignee.

(2) (E83-0004), Ser. No. 08/239,380, filed May 6, 1994 U.S. Pat. No. 5,431,328, entitled "Composite Bump Flip Chip Bonding" assigned to the same assignee.

(3) (E83-0003A), U.S. Pat. No. 5,393,697, to Chang et al, Feb. 28, 1995, entitled "Composite Bump Structure and Methods of Fabrication," filed May 6, 1994.

(4) (E83-0003B), Ser. No. 08/387,095, filed Feb. 13, 1995 now abandoned, entitled "Composite Bump Structure and Methods of Fabrication," assigned to the same assignee.

(5) (E84-0010), Ser. No. 08/494,582, filed Jun. 23, 1995 U.S. Pat. No. 5,578,527, entitled "Connection Construction and Method of Manufacturing the Same," assigned to the same assignee.

(6) (ERSO-84-0053), Ser. No. 08/578,929, filed Dec. 27, 1995 entitled "Composite Bump Tape Automated Bonding Method And Bonded Structure" assigned to the same assignee now U.S. Pat. No. 5,749,997.

BACKGROUND OF THE INVENTION

(1) Field of the Invention

The invention relates to the use of an anisotropic conductive film, having conductive particles in an insulating adhesive, with tape automated bonding to form interconnections between a lead array and an integrated circuit element. The use of an anisotropic conductive film provides a bonding process with reduced temperature and pressure and a reliable encapsulated bonded structure.

(2) Description of Related

In conventional tape automated bonding high temperatures are required to form the bond between the inner lead ends of a lead array and the bonding pads on an integrated circuit element. The difference in thermal expansion between the elements of the assembly can distort the lead array and make subsequent processing, such as bonding the outer lead ends, difficult. This invention provides a method to avoid this problem by using an anisotropic conductive film in combination with tape automated bonding. The anisotropic conductive film comprises conductive particles in an insulating adhesive.

U.S. Pat. No. 4,963,002 to Tagusa et al. describes a connection construction using conductive particles and both conductive and insulating adhesives. Japanese Patent 3-62927 to Fujimoto describes a composite conductive particle, an adhesive layer, and flip chip bonding.

U. S. Pat. No. 5,001,542 to Tsukagoshi et al. describes a board made of glass, synthetic resin, metal ceramic or their composite materials. One variation of the disclosed board has a center part removed for a film carrier or TAB structure. Tsukagoshi et al. use a combination of deformable conducting particles, rigid conducting particles, and an adhesive to form the electrical bond. The Tape Automated bonding structure and method of this Invention uses a different, and more flexible, lead frame. This Invention uses an anisotropic conducting film using an adhesive with a different type conducting particles than Tsukagoshi et al. The method used to form the bond are different from Tsukagoshi et al.

U.S. Pat. No. 4,470,657 to Tsukagoshi et al. describes the use of an anisotropic conductive film using an adhesive with conductive particles of multiple sizes. Tape Automated Bonding is not described in this patent.

U.S. Pat. No. 4,731,282 to Tsukagoshi et al. describes insulating adhesives.

SUMMARY OF THE INVENTION

A diagram of a conventional TAB, or tape automated bonding setup is shown in FIG. 1. A lead array having leads 22 of a metal such as copper are formed on a dielectric layer 23 such as polyimide. The inner end of the leads contact conductive bonding pads 21, of a material such as gold, formed on an integrated circuit element 20. Heat energy at a chosen temperature and pressure, for a chosen time is delivered by a thermode 10 which is brought into contact with the leads of the lead array and a bond is formed between the inner ends of the leads 22 and the conductive bonding pads 21.

In conventional tape automated bonding high temperatures, often between 450° C. and 550° C., are required to form the bond between the inner lead end of the lead array and the bonding pad on the integrated circuit element. The difference in thermal expansion between the copper lead 22 and the dielectric layer 23 which will distort the lead array and make subsequent processing, such as bonding the outer lead ends, difficult. Frequently the hardness of the gold bump can transmit damaging forces from the thermode to the integrated circuit element. The planarity of the thermode with respect to the bonding pads becomes very important and increases the cost of the equipment used in the bonding process. In conventional tape automated bonding it is important to encapsulate the bond as soon as it has been formed to prevent damage due for example to moisture and corrosion.

It is an object of this invention to provide a low cost method of tape automated bonding which uses lower temperature and pressure in the bonding process and provides a bond which is automatically encapsulated after the bonding has been completed.

It is a further object of this invention to provide a bonded structure formed using a low cost method of tape automated bonding which uses lower temperature and pressure in the bonding process and which is automatically encapsulated after the bonding has been completed.

These objectives are achieved using an anisotropic conductive film in the bonding process. The anisotropic film comprises conductive particles in an insulating adhesive. Using the anisotropic conductive film conductive particles 31 are placed between the leads 22 of the lead array and the conductive bonding pads 21 formed on the integrated circuit element 20, see FIGS. 2A and 2B. The conductive particles compensate for deviations in planarity between the thermode and the conductive bonding pads so the bonding pressure can be substantially reduced, between about 20 and 40 kilograms/cm$^2$. When the bond is formed the insulating adhesive 32 forms an encapsulation of the bond which protects the bond from moisture, corrosion, and mechanical damage. The bonding temperatures required are between about 150° C. and 180° C. and the insulating adhesive forms an adhesive bond to keep the electrical bond in place.

The lead array can be of the window type such as that shown in FIG. 2C. A lead array having leads 22 formed of a material such as copper are formed on a dielectric layer 23 formed of a material such as polyimide. The dielectric layer has an inner perimeter 73 bounding a region 75 with no dielectric material. The inner lead ends 74 of the leads extend into the region of no dielectric material. In this type of lead array an isolation film comprising a metal foil layer 27 formed on a polyimide layer 25 is used in the bonding process, see FIG. 2A.

The lead array can also be of the type shown in FIG. 2D where there is no window and the leads 22 of the lead array are formed entirely on the polyimide layer 23. In this type of lead frame the isolation film is not required, as shown in FIG. 2B.

The insulating adhesive in the anisotropic conductive film can be a thermoplastic material, a thermosetting material, or a type of material which is both thermoplastic and thermosetting. The conductive particles can be metal spheres, graphite particles, or composite particles having a polymer body covered by a conductive metal coating.

BRIEF DESCRIPTION OF THE DRAWINGS

FIG. 1 shows a diagram of a conventional tape automated bonding set up.

FIG. 2A shows a cross section of a bonded structure formed using an anisotropic conductive film, a lead array with a window, and tape automated bonding.

FIG. 2B shows a cross section of a bonded structure formed using an anisotropic conductive film, a lead array without a window, and tape automated bonding.

DESCRIPTION OF THE PREFERRED EMBODIMENTS

Figure 2C:
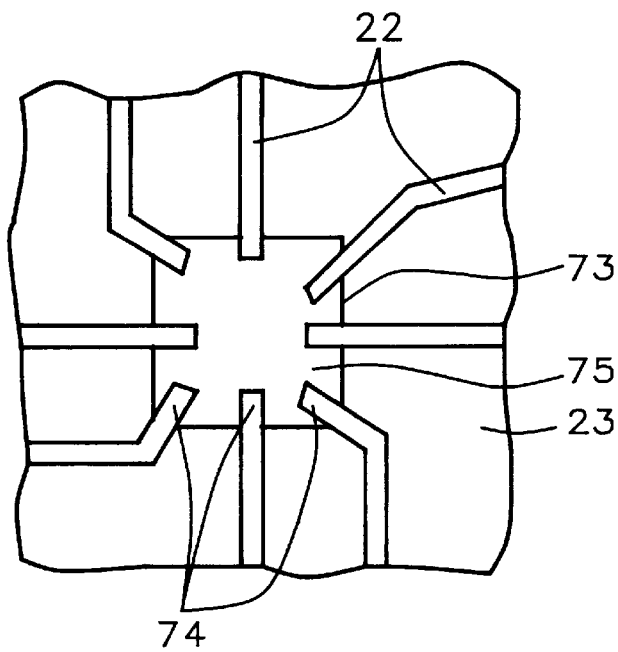
FIG. 2C shows a top view of a lead array with a window.
Figure 3A:
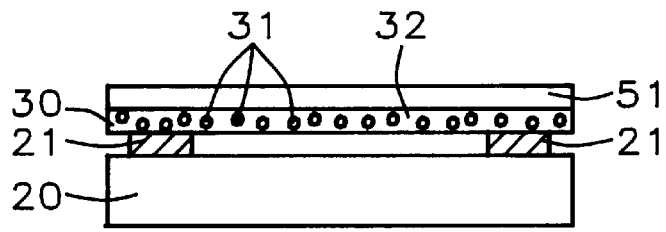
FIG. 3A shows a cross section of an anisotropic conductive film placed on an integrated circuit element covering the conductive bonding pads.

Refer now to FIGS. 2A, 2C, 3A–3E, 5A–5E, 6A, and 6B, there is shown an embodiment of a method of forming a bonded structure using an anisotropic conductive film, a lead array with a window, and tape automated bonding. FIG. 3A shows a cross section view of an integrated circuit element 20 having conductive bonding pads 21, in this example gold, formed thereon. An anisotropic conductive film 30 is cut to the proper size and placed over the integrated circuit element 20 so that the anisotropic film contacts the gold bonding pads 21. The anisotropic conductive film 30 comprises conductive particles 31 in an insulating adhesive 32 formed on a protective layer 51.

Figure 5A:
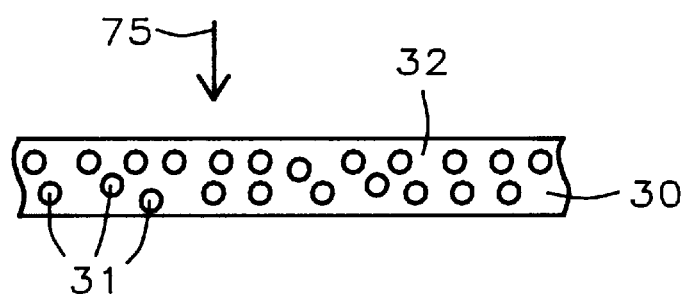
FIG. 5A shows a cross section view of the anisotropic conductive film.
Figure 5B:
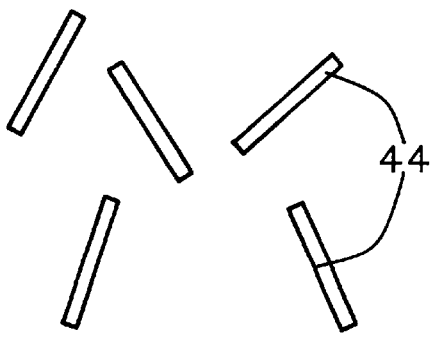
FIG. 5B shows graphite conductive particles for the anisotropic conductive film.
Figure 5C:
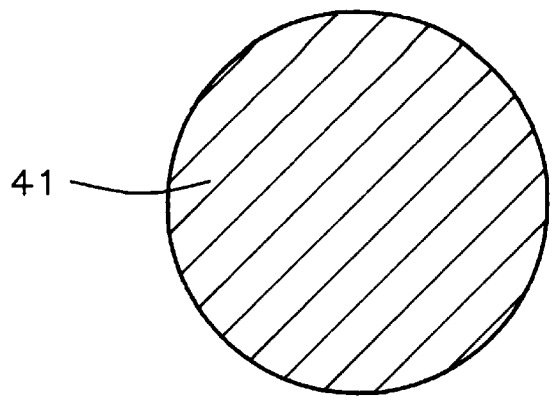
FIG. 5C shows metal spheres as conductive particles for the anisotropic conductive film.
Figure 5D:
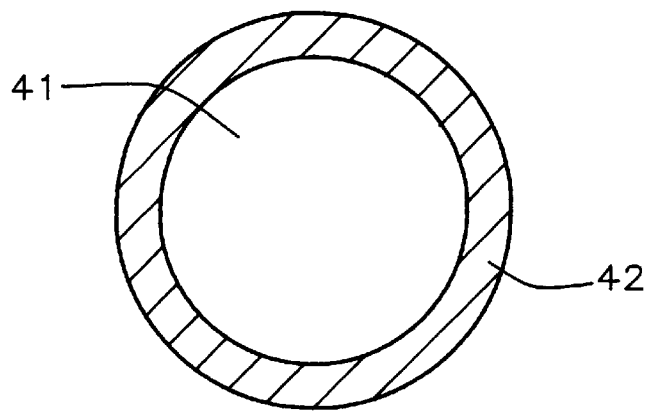
FIG. 5D shows composite particles with a polymer body covered by a conductive metal coating as conductive particles for the anisotropic conductive film.
Figure 5E:
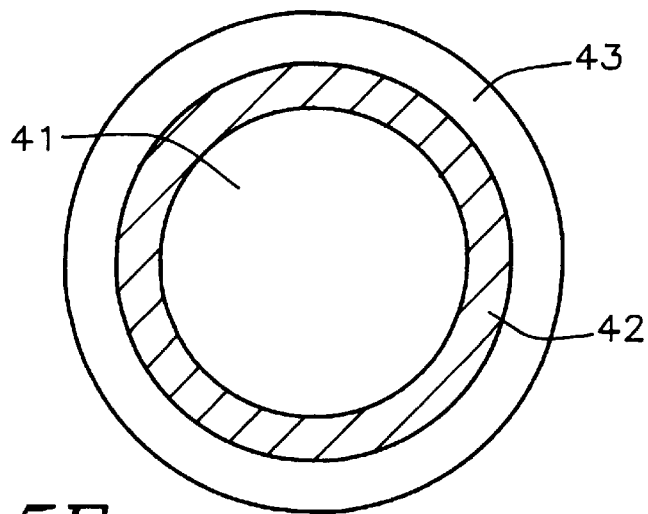
FIG. 5E shows composite particles with a first polymer body, covered by a conductive metal coating, and covered by a second polymer layer as conductive particles for the anisotropic conductive film.
Figure 6A:
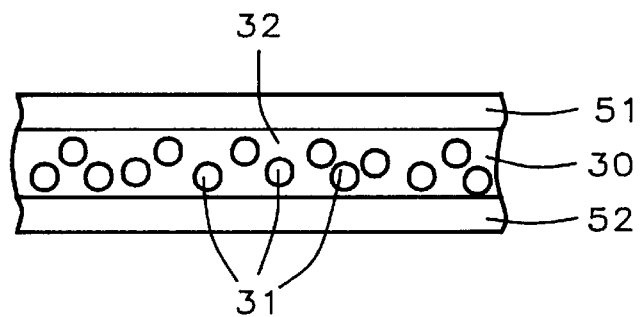
FIG. 6A shows a cross section view of an anisotropic conductive film with a protective layer on both sides of the film.
Figure 6B:
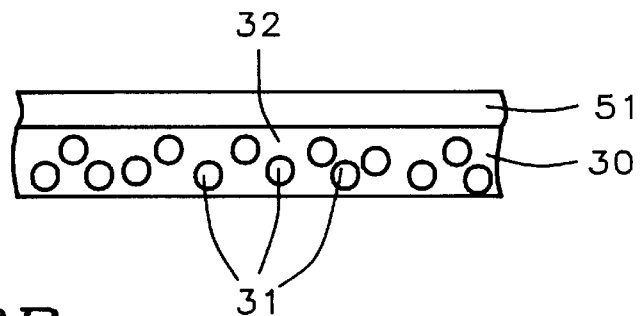
FIG. 6B shows a cross section view of an anisotropic conductive film with a dielectric layer on one side of the film.

The anisotropic conductive film 30, comprising conductive particles 31 and an insulating adhesive 32, without the dielectric layer is shown in FIG. 5A. Some examples of the conductive particles are shown in FIGS. 5B–5E. The conductive particles can be graphite 44 as shown in FIG. 5B, metal spheres 41 as shown in FIG. 5C, a composite particle having a polymer body 41 covered by a conductive metal coating 42 as shown in FIG. 5D, or a composite particle having a polymer body 41 covered by a conductive metal coating covered by a polymer coating 43 as shown in FIG. 5E. Some examples of the anisotropic conductive film are shown in FIGS. 6A and 6B. As shown in FIG. 6A the anisotropic conductive film 30 comprising conductive particles 31 in an insulating adhesive 32 can have a protective layer 51 and 52 on both sides of the anisotropic conductive film. As shown in FIG. 6B the anisotropic conductive film 30 comprising conductive particles 31 in an insulating adhesive 32 can have a protective layer 51 on only one side of the anisotropic conductive film. Referring now to FIG. 5A, when the anisotropic conductive film is compressed in the direction of the arrow 75 the film will conduct in the direction of the arrow but remains an insulator in directions orthogonal to the arrow 75.

Figure 3B:
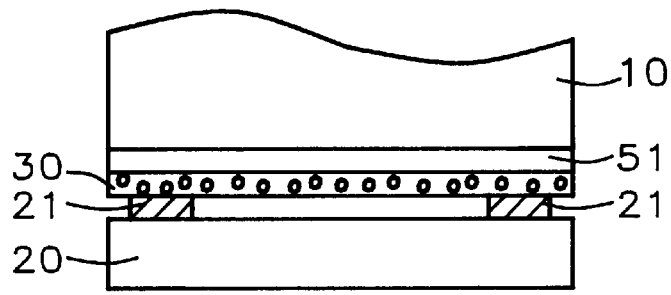
FIG. 3B shows a cross section view of a thermode in contact with an anisotropic film placed on an integrated circuit element.
Figure 3C:
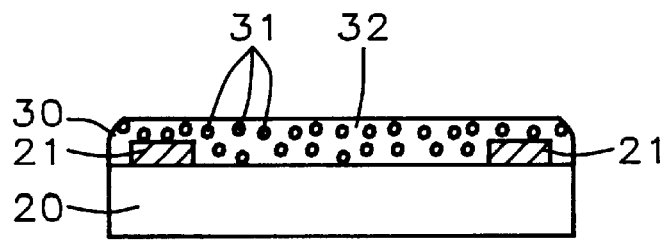
FIG. 3C shows a cross section of an anisotropic conductive film on an integrated circuit element which has been pre heated.

Refer now to FIG. 3B, there is shown a cross section view of a thermode 10 brought into contact with the protective layer 51 on one side of the anisotropic conductive film 30. The thermode 10 can deliver heat energy at a chosen temperature and pressure to objects in contact with the thermode. The thermode preheats the anisotropic conductive film to a temperature of between about 95° C. and 120° C. at a pressure of between about 5 and 10 kilograms/cm$^2$ for between about 3 and 5 seconds. This preheat cycle causes the insulating adhesive to flow slightly completely covering the gold bonding pads 21, as shown in FIG. 3C. As shown in FIG. 3C, the protective layer 51 is then removed from the anisotropic conductive film.

Figure 3D:
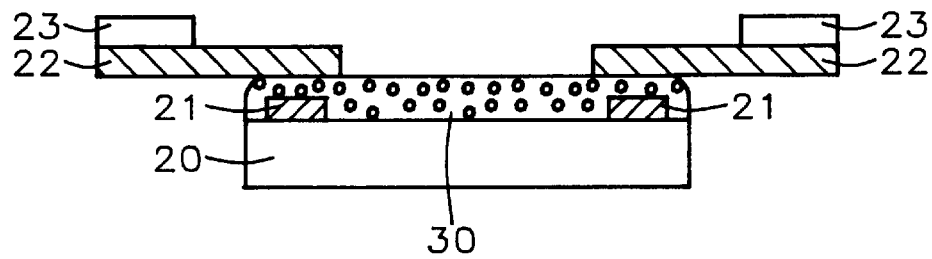
FIG. 3D shows a cross section view of a lead array with a window placed on an anisotropic conductive film placed on an integrated circuit element and preheated.

Next, as shown in FIG. 3D, a lead array comprising metal conducting leads 22 formed on a first dielectric layer 23 is placed on the anisotropic conductive film 30 so that the inner ends of the metal conducting leads 22 are over the gold bonding pads 21 of the integrated circuit element 20. In this example the metal conducting leads 22 are copper and the first dielectric layer 23 is polyimide. A top view of the lead array is shown in FIG. 2C. As shown in FIG. 2C, the first dielectric layer 23 has an inner perimeter 73 bounding a center region 75 having no dielectric material. In this lead array the inner ends of the leads 22 extend into the region having no dielectric material. This extension of the inner lead ends into the region of no dielectric material can also be seen in FIG. 3D.

Figure 3E:
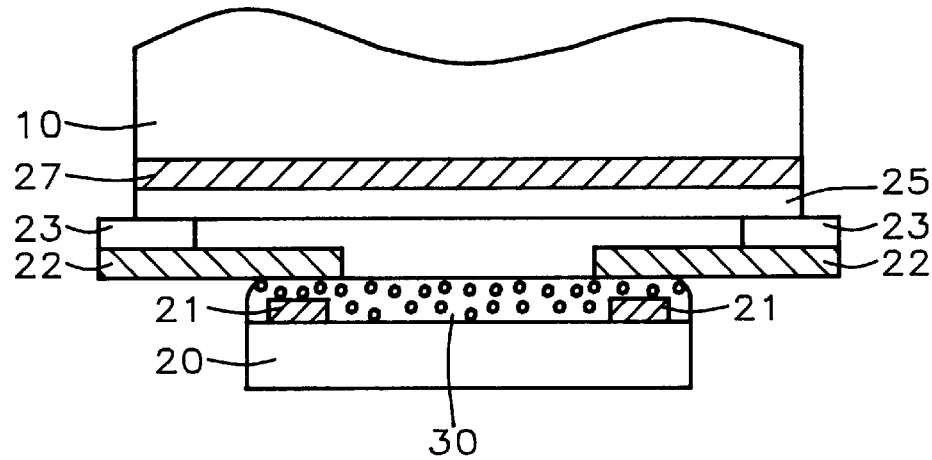
FIG. 3E shows the structure of FIG. 3D with an isolation film placed on the lead array and a thermode applied to the isolation film.

Next, as shown in FIG. 3E, an isolation layer comprising a metal foil layer 27 formed on a second dielectric layer 25. In this example the second dielectric layer 25 is polyimide and the metal foil layer 27 is aluminum. The isolation layer is placed so that the isolation layer covers the window or region of the lead array with no first dielectric material, the second dielectric material 25 of the isolation layer contacts the first dielectric material 23 around the entire inner perimeter of the lead array bounding the window, and the second dielectric layer 25 of the isolation layer separates the metal foil 27 of the isolation layer from the lead array.

Next, as shown in FIG. 3E, the thermode 10 is brought into contact with the metal foil 27 of the isolation layer. The thermode delivers heat energy at a temperature of between about 150° C. and 180° C. and a pressure of between about 20 and 40 kilograms/cm² for between about 5 and 20 seconds to isolation layer, lead array, gold bonding pad, and integrated circuit element assembly shown in FIG. 3E thereby forming the completed bonded structure shown in FIG. 2A. During the bonding the temperature of the thermode will rise to between about 280° C. and 300° C.

An embodiment of the completed bonded structure formed by the method of the preceding embodiment is shown in FIG. 2A. The gold bonding pads 21 are formed on the integrated circuit element 20. The inner lead ends of the copper leads 22 of the lead array are positioned so that one inner lead end overlays each gold bonding pad 21 forming a bonding pair. When the assembly is compressed during the bonding process described above a number of conductive particles 31 in the anisotropic conductive film are between the inner lead end and gold bonding pad of each bonding pair and the conductive particles 31 make electrical contact with the lead end and gold bonding pad of each bonding pair. The second dielectric layer 25 of the isolation layer contacts the insulating adhesive 32 of the anisotropic conductive film and the first dielectric layer 23 of the lead array at the inner perimeter of the window. The insulating adhesive reflows during the time heat and pressure is delivered to the assembly by the thermode and encapsulates the bonded structure and holds the entire assembly together after curing. The insulating adhesive can be a material such as epoxy and can be thermoplastic, thermosetting, or a mixture of thermoplastic and thermosetting. The isolation layer described in this example is an aluminum foil 27 formed on a layer of polymer 25 but can also be a layer of silicone rubber formed on a layer of polymer or other such materials.

Figure 2D:
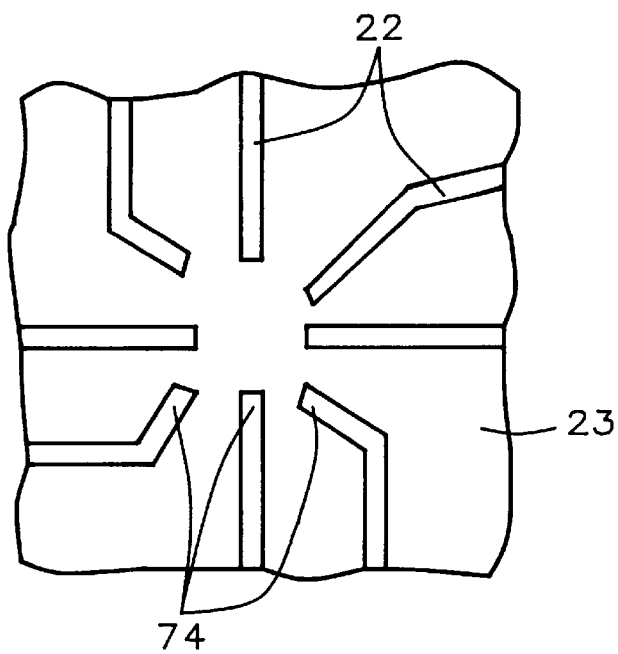
FIG. 2D shows a top view of a lead array without a window.
Figure 4A:
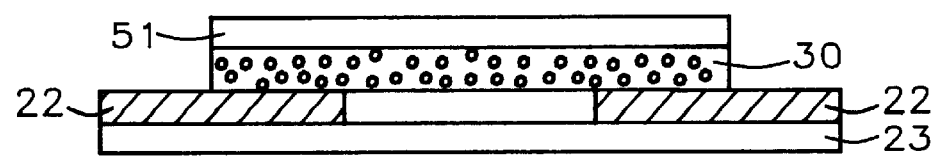
FIG. 4A shows a cross section view of an anisotropic conductive film with protective backing placed on a lead array without a window.

Refer now to FIGS. 2B, 2D, 4A–4E, 5A–5E, 6A, and 6B, there is shown another embodiment of a method of forming a bonded structure using an anisotropic conductive film, a lead array without a window, and tape automated bonding. FIG. 4A shows a cross section view of an anisotropic conductive film 30 with a protective backing 51 on one side of the conductive film placed on a lead array comprising a first dielectric layer 23 and metal leads 22. FIG. 2D shows a top view of the lead array for this embodiment. The metal leads 22 are formed on the first dielectric layer 23 which in this embodiment has no window without dielectric material. The inner ends 74 of the leads are formed on the first dielectric layer 23.

The anisotropic conductive film 30, comprising conductive particles 31 and an insulating adhesive 32, without the protective layer is shown in FIG. 5A. Some examples of the conductive particles are shown in FIGS. 5B–5E. The conductive particles can be graphite 44 as shown in FIG. 5B, metal spheres 41 as shown in FIG. 5C, a composite particle having a polymer body 41 covered by a conductive metal coating 42 as shown in FIG. 5D, or a composite particle having a polymer body 41 covered by a conductive metal coating covered by a polymer coating 43 as shown in FIG. 5E. Some examples of the anisotropic conductive film are shown in FIGS. 6A and 6B. As shown in FIG. 6A the anisotropic conductive film 30 comprising conductive particles 31 in an insulating adhesive 32 can have a protective layer 51 and 52 on both sides of the anisotropic conductive film. As shown in FIG. 6B the anisotropic conductive film 30 comprising conductive particles 31 in an insulating adhesive 32 can have a protective layer 51 on only one side of the anisotropic conductive film. Referring now to FIG. 5A, when the anisotropic conductive film is compressed in the direction of the arrow 75 the conduction will occur in the direction of the arrow but the film remains an insulator in directions orthogonal to the arrow 75.

Refer again to FIG. 4A, the anisotropic conductive film 30 is cut to the proper size and placed on the lead array. The anisotropic conductive film has a protective layer 51 on one side of the anisotropic conductive film and is placed on the lead array so that the insulating adhesive contacts and covers the inner lead ends of the lead array. The lead array comprises metal leads 22 formed on a first dielectric layer 23. In this example the leads 22 of the lead array are copper, the first dielectric material in the first dielectric layer 23 is polyimide, and the insulating adhesive is a thermoplastic material, a thermosetting material, or a combination of thermoplastic and thermosetting materials.

Figure 4B:
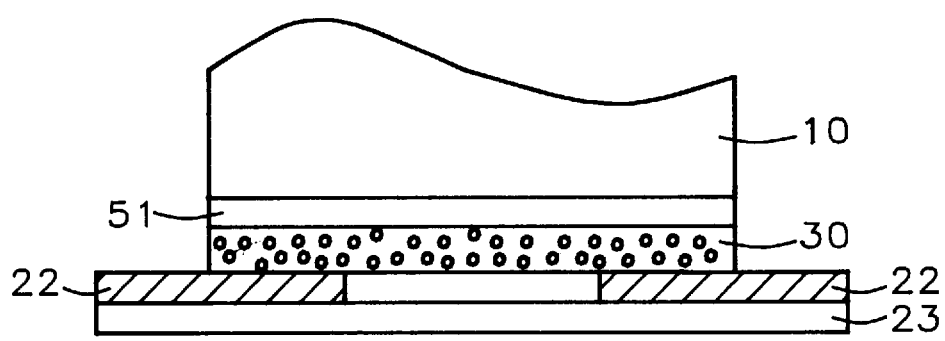
FIG. 4B shows a thermode in contact with an anisotropic conductive film with a protective backing placed on a lead array without a window.
Figure 4C:
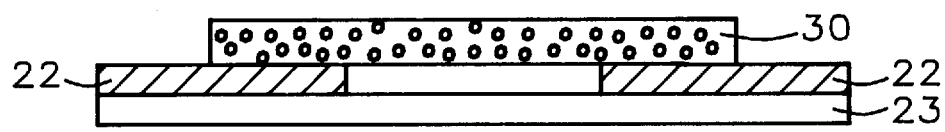
FIG. 4C shows a cross section view of an anisotropic conductive film on a lead array after pre heating and removal of the protective backing.

Next, as shown in FIG. 4B, the thermode 10 is brought into contact with the protective layer on the anisotropic conductive film and the assembly is pre heated to a temperature of between about 95° C. and 120° C. at a pressure of between about 5 and 10 kilograms/cm² for between about 3 and 5 seconds. As shown in FIG. 4C, the pre heating attaches the insulating adhesive to the inner lead ends of the lead array but does not cause the insulating adhesive to flow. As shown in FIG. 4C, the protective layer is then removed.

Figure 4D:
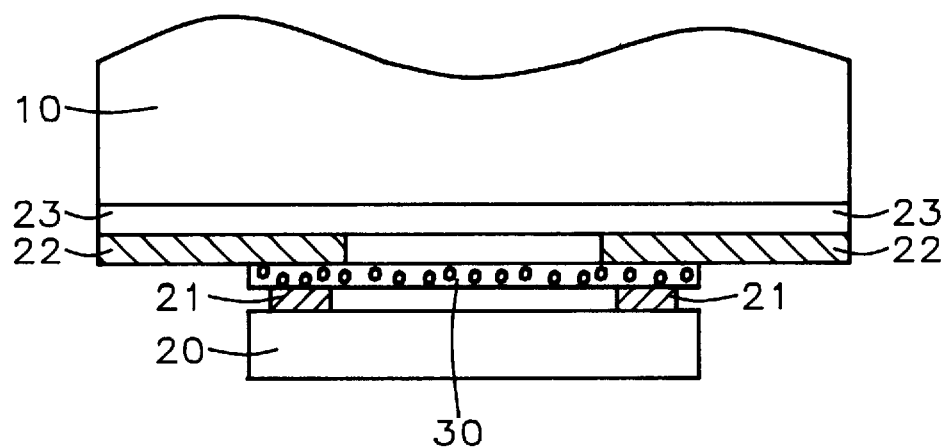
FIG. 4D shows a cross section view of a bonding set up for tape automated bonding using a lead array without a window and applying heat to the lead array.

Next, as shown in FIG. 4D, the lead array—anisotropic conductive film assembly of FIG. 4C is placed on the integrated circuit element and positioned so that one inner lead end overlays each gold bonding pad 21 forming a bonding pair. When the assembly is compressed during the bonding process a number of conductive particles 31 in the anisotropic conductive film will be between the inner lead end and gold bonding pad of each bonding pair and the conductive particles 31 will make electrical contact with the lead end and gold bonding pad of each bonding pair.

As shown in FIG. 4D the a thermode 10 is then brought into contact with the first dielectric layer 23 of the lead array and the thermode heats the assembly to a temperature of between about 150° C. and 180° C. at a pressure of between about 20 and 40 kilograms/cm² for between about 5 and 20 seconds thereby forming the completed bonded structure shown in FIG. 2B.

Figure 4E:
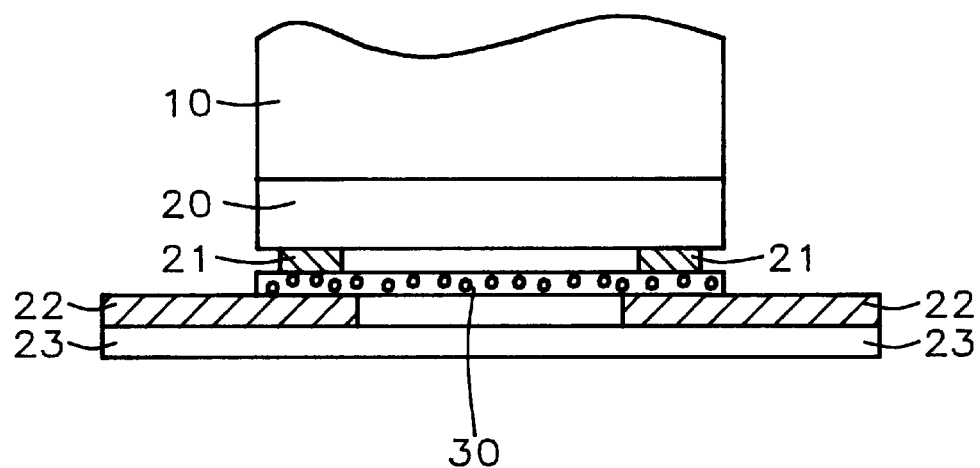
FIG. 4E shows a cross section view of a bonding set up for tape automated bonding using a lead array without a window and applying heat to the integrated circuit element.

An alternative bonding method is shown in FIG. 4E. Again the lead array—anisotropic conductive film assembly of FIG. 4C is placed on the integrated circuit element and positioned so that one inner lead end overlays each gold bonding pad 21 forming a bonding pair. When the assembly is compressed during the bonding process a number of conductive particles 31 in the anisotropic conductive film will be between the inner lead end and gold bonding pad of each bonding pair and the conductive particles 31 will make electrical contact with the lead end and gold bonding pad of each bonding pair. In this method, as shown in FIG. 4E, a thermode 10 is then brought into contact with the back side of the integrated circuit element 20, the side opposite that on which the conductive bonding pads 21 are formed, and the thermode heats the assembly to a temperature of between about 150° C. and 180° C. at a pressure of between about 20 and 40 kilograms/cm$^2$ for between about 5 and 20 seconds thereby forming the completed bonded structure shown in FIG. 2B.

An embodiment of the completed bonded structure formed by the method of the preceding embodiment is shown in FIG. 2B. The gold bonding pads 21 are formed on the integrated circuit element 20. The inner lead ends of the copper leads 22 of the lead array are positioned so that one inner lead end overlays each gold bonding pad 21 forming a bonding pair. When the assembly is compressed during the bonding process described above a number of conductive particles 31 in the anisotropic conductive film are between the inner lead end and gold bonding pad of each bonding pair and the conductive particles 31 make electrical contact with the lead end and gold bonding pad of each bonding pair. The insulating adhesive reflows during the time heat and pressure is delivered to the assembly by the thermode and encapsulates the bonded structure and holds the entire assembly together after curing. The insulating adhesive can be a material such as epoxy and can be thermoplastic, thermosetting, or a mixture of thermoplastic and thermosetting.

Figure 7:
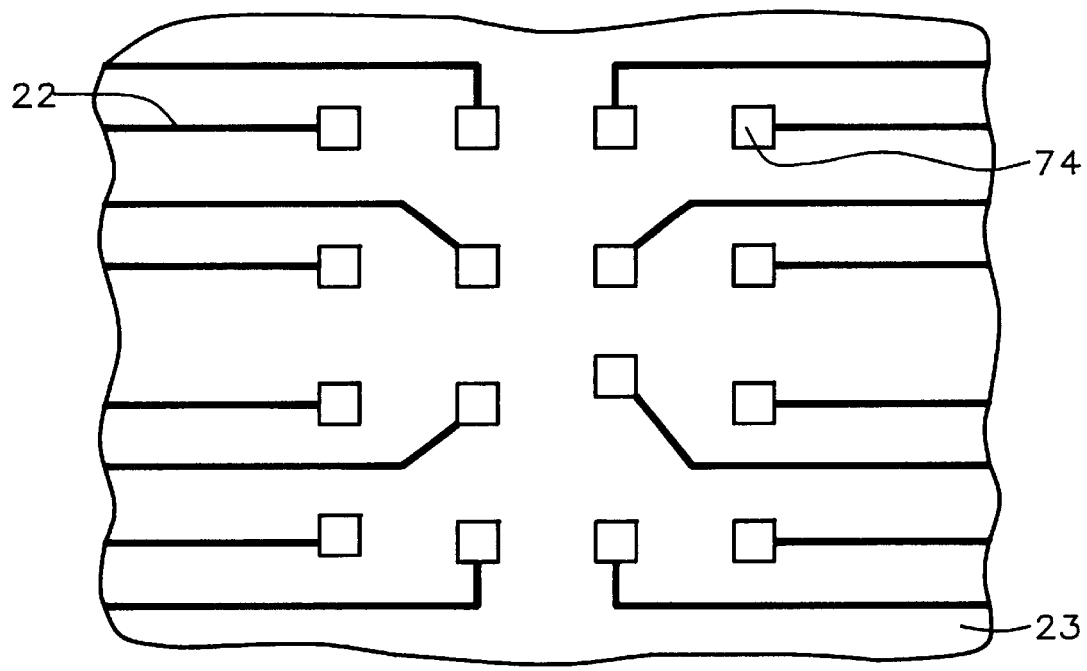
FIG. 7 shows a top view of a lead array without a window.

In the method and structure of this embodiment the lead array can have an area array of inner lead ends as shown in FIG. 7. The inner lead ends 74 of the leads 22 in the lead array are formed on a first dielectric layer 23 without a window. In this example the leads 22 and the inner lead ends 74 are copper.

While the invention has been particularly shown and described with reference to the preferred embodiments thereof, it will be understood by those skilled in the art that various changes in form and details may be made without departing from the spirit and scope of the invention.

What is claimed is:

1. A method of forming a bonded structure, comprising the steps of:

providing an integrated circuit element having gold conductive bonding pads;

providing an anisotropic conductive film comprising conductive particles dispersed in a layer of insulating adhesive formed on a protective film;

providing a first dielectric layer formed of first dielectric material;

providing a lead array having a number of conductive leads formed on said first dielectric layer wherein each said conductive lead has an inner lead end and an outer lead end, said first dielectric layer has an inner perimeter forming a window having no first dielectric material, and each said inner lead end extends beyond said inner perimeter into said window;

providing an isolation film comprising a layer of support metal formed on a layer of second dielectric material;

providing a thermode whereby heat energy can be supplied for a selected time at a selected temperature and pressure;

placing a preformed piece of said anisotropic conductive film over said integrated circuit element so that a number of said conductive particles contact said gold conductive bonding pads;

delivering heat energy at a first temperature and a first pressure for a first time through said protective film to said anisotropic conductive film by means of said thermode;

removing said layer of protective film;

forming a number of bonding pairs comprising one of said inner lead ends, one of said gold conductive bonding pads, and those said conductive particles between one of said inner lead ends and one of said gold conductive bonding pads by means of placing said lead array over said conductive particles dispersed in a layer of insulating adhesive so that each said inner lead end is over one of said gold conductive bonding pads;

placing a preformed piece of said isolation film over said lead array so that said preformed piece of isolation film covers said window and said layer of second dielectric material is between said lead array and said layer of support metal; and delivering heat energy at a second temperature and a second pressure for a second time to said isolation film, said layer of insulating dielectric, and said bonding pairs by means of said thermode thereby forming an electrical bond between said conductive particles, said inner lead end, and said gold conductive bonding pad in each said bonding pair.

2. The method of claim 1 wherein said first temperature is between about 95° C. and 120° C., said first pressure is between about 5 and 10 kilograms/cm$^2$ and said first time is between about 3 and 5 seconds.

3. The method of claim 1 wherein said second temperature is between about 150° C. and 180° C., said second pressure is between about 20 and 40 kilograms/cm$^2$, and said second time is between about 5 and 20 seconds.

4. The method of claim 1 wherein said conductive leads are copper.

5. The method of claim 1 wherein said conductive particles are metal.

6. A method of forming a bonded structure, comprising the steps of:

providing an integrated circuit element having gold conductive bonding pads;

providing an anisotropic conductive film comprising conductive particles dispersed in a layer of insulating adhesive formed on a protective film;

providing a dielectric layer;

providing a lead array having a number of conductive leads formed on said dielectric layer wherein each said conductive lead has an inner lead end and an outer lead end;

providing a thermode whereby heat energy can be supplied for a selected time at a selected temperature and pressure;

placing a preformed piece of anisotropic conductive film over said lead array so that said conductive particles dispersed in a layer of insulating adhesive contact said inner lead ends;

delivering heat energy at a first temperature and a first pressure for a first time through said protective film to said anisotropic conductive film by means of said thermode;

removing said protective film;

forming a number of bonding pairs wherein each said bonding pair comprises one of said inner lead ends, one of said gold conductive bonding pads, and those said conductive particles between one of said inner lead ends and one of said gold conductive bonding pads by means of placing said lead array over said conductive particles dispersed in said layer of insulating adhesive so that each said inner lead end is over one of said gold conductive bonding pads; and delivering heat energy at a second temperature and a second pressure for a second time to said bonding pairs and said layer of insulating adhesive by means of said thermode thereby forming an electrical bond between said conductive particles, said inner lead end, and said gold conductive bonding pad in each said bonding pair.

7. The method of claim 6 wherein said first temperature is between about 95° C. and 120° C., said first pressure is between about 5 and 10 kilograms/cm$^2$ and said first time is between about 3 and 5 seconds.

8. The method of claim 6 wherein said second temperature is between about 150° C. and 300° C., said second pressure is between about 20 and 40 kilograms/cm$^2$, and said second time is between about 5 and 20 seconds.

9. The method of claim 6 wherein said conductive leads are copper.

10. The method of claim 6 wherein said conductive particles are metal.

* * * * *